(12) United States Patent
Daraktchiev et al.

(10) Patent No.: US 6,457,360 B1
(45) Date of Patent: Oct. 1, 2002

(54) HIGH-PRECISION INTEGRATED SEMICONDUCTOR PEIZORESISTIVE DETECTOR DEVICES AND METHODS USING THE SAME

(75) Inventors: Ivan Stoykov Daraktchiev, Zaventem (BE); Vladimir Trifonov Stavrov, Botevgrad (BG)

(73) Assignee: Conel Ltd., Botevgrad (BG)

( * ) Notice: Subject to any disclaimer, the term of this patent is extended or adjusted under 35 U.S.C. 154(b) by 0 days.

(21) Appl. No.: 09/792,627

(22) Filed: Feb. 21, 2001

(51) Int. Cl.$^7$ ............................................... G01N 29/04
(52) U.S. Cl. ..................... 73/579; 73/504.4; 73/504.15; 73/514.29
(58) Field of Search .................... 73/579, 584, 1.82, 73/31.06, 504.04, 514.29, 504.15, 504.12, 56.24, 56.25

(56) References Cited

U.S. PATENT DOCUMENTS

| | | | | |
|---|---|---|---|---|
| 4,674,319 A | * | 6/1987 | Muller et al. | 73/24.01 |
| 5,905,202 A | * | 5/1999 | Kubena et al. | 73/504.15 |
| 5,952,572 A | * | 9/1999 | Yamashita et al. | 73/504.04 |
| 6,000,280 A | | 12/1999 | Miller et al. | 73/105 |
| 6,109,105 A | * | 8/2000 | Kubena et al. | 73/504.15 |
| 6,126,311 A | * | 10/2000 | Schuh | 374/21 |
| 6,211,598 B1 | | 4/2001 | Dhuler et al. | 310/307 |
| 6,262,512 B1 | | 7/2001 | Mahadevan | |
| 6,269,698 B1 | * | 8/2001 | Woodruff | 73/514.29 |
| 6,289,564 B1 | | 9/2001 | Novotny | |
| 6,311,549 B1 | * | 11/2001 | Thundat et al. | 73/54.24 |
| 6,312,959 B1 | | 11/2001 | Datskos | 436/147 |
| 6,333,583 B1 | | 12/2001 | Mahadevan et al. | 310/306 |

OTHER PUBLICATIONS

Raiteri et al., "Micromechanical cantilever-based biosensors" *Sensors and Actuators*, B 79 115–126 (2001).

* cited by examiner

Primary Examiner—Hezron Williams
Assistant Examiner—Jacques Saint-Surin
(74) Attorney, Agent, or Firm—Townsend and Townsend and Crew LLP

(57) ABSTRACT

An integrated semiconductor MEMS detector device includes a piezo-resistive detector located at a fixed end of a cantilever, a bi-layer resonance actuator including two thin layer materials having different thermal expansion coefficients, wherein one of the actuator layers serves as a heating element and the other serves as insulating layer between the heating element layer and the cantilever, and a sensing element located at the free end of the cantilever, which serves, dependent on the particular application, as a gravitational mass, an absorber of energy, a gas- or vapor-adsorber, etc. Registration of the resonance frequency of the free end of the cantilever is performed both before and after an interaction (e.g., exposure to energy, materials/mass changes due to chemical reactions or/and physical interactions, etc.) and the change in resonance frequency due to the interaction is used to determine a parameter associated with the interaction, such as for example, an amount of radiation absorbed or an amount of a substance adsorbed/desorbed. The heating element of the bi-layer actuator is powered by an alternating current (a.c.) source so as to create a stable vibration that is measured by the piezo-detector (e.g., piezo-resistor) to thereby register the resonance frequency peak.

17 Claims, 3 Drawing Sheets

HIGH-PRECISION INTEGRATED SEMICONDUCTOR PEIZORESISTIVE DETECTOR DEVICES AND METHODS USING THE SAME

BACKGROUND OF THE INVENTION

The present invention generally relates to integrated semiconductor Micro-Electro-Mechanical System (MEMS) devices, and more particularly to integrated MEMS detection devices that are highly sensitive to changes of mass and/or energy to which they are exposed. MEMS devices according to the present invention are useful for a variety of applications in control, testing and analytical systems.

MEMS devices are currently widely used in control and measurement systems and the area of their application is becoming ever broader due to the easy integration of such devices into electronic components and modules.

A MEMS beam or cantilever can be brought to a stable oscillation at its resonance frequency, which is dependent on the geometry, effective mass, temperature and the elasticity modulus of the materials involved. Registration of a measured value is typically done by measuring the electrical resistance of a piezo-resistor or the resonance frequency of the system. Using this measurement technique, a registration of very small changes of the effective mass, or weak interactions leading to change of the geometrical parameters of the system can be achieved.

Typically, mechanical vibrations are generated by an external source, for example, a piezo-crystal, in direct contact with the cantilever measured. However, such an approach does not provide satisfactory results for many applications where high precision and accuracy are desired.

Accordingly it is desirable to provide integrated MEMS detection devices that provide reliable measurement results with high precision and accuracy.

SUMMARY OF THE INVENTION

The present invention provides integrated MEMS detection devices, and methods using the same, that provide high precision and accurate measurement results for a variety detection applications.

According to the present invention, integrated semiconductor piezo-resistive MEMS detector devices (e.g., sensors) are provided which include a piezo-resistive detector located at a fixed end of a MEMS cantilever, a bi-layer resonance actuator including two thin film layers, each layer having a different thermal expansion coefficient than the other layer (e.g., $SiO_2$ and Al), wherein one of the actuator layers serves as a heating element and the other serves as an insulating layer between the heating element layer and the cantilever, and a sensing element located at the free end of the cantilever. The sensing element serves, dependent on the particular application, as a gravitational mass, an absorber of energy, a gas- or vapor-adsorber, etc. The detector devices are preferably made of/integrated onto a piezo-resistive material, such as, e.g., Silicon (Si).

According to the present invention, registration of the resonance frequency of the cantilever is performed both before and after an interaction (e.g., exposure to energy, materials/mass changes due to chemical reactions or/and physical interactions, etc.) and the change in resonance frequency due to the interaction is used to determine a parameter associated with the interaction, such as for example, a change in the flux of energy (intensity of light) exposing the sensing element, an amount of radiation absorbed or an amount of a substance adsorbed/desorbed. Rather than using complicated circuitry to bring the cantilever into a state of oscillation at its resonance frequency, a bi-layer actuator including a heating element layer powered by an alternating current (a.c.) source is used to create a stable vibration that is measured by the piezo-detector (e.g., piezo-resistor) to thereby register the resonance frequency peak.

According to an aspect of the invention, an integrated micro-electro-mechanical detection device is provided that typically comprises a cantilever having a free end and a fixed end coupled to a substrate, a piezo-resistive detector coupled to the fixed end of the cantilever, and a sensing element located on the free end of the cantilever. The detection device also typically includes an actuator including a first thin film deposited on the cantilever and a second thin film deposited on the first thin film. In operation, application of an alternating current to the second thin film causes the free end of the cantilever to vibrate at substantially the same frequency as the applied alternating current, wherein an output voltage of the piezo-resistive detector is proportional to the phase of the applied alternating current.

According to another aspect of the invention, a method is provided for measuring the resonance frequency of a cantilever in a micro-electro-mechanical detection device having a sensing element coupled to a free end of the cantilever and a piezo-resistive detector element coupled to a fixed end of the cantilever. The detection device also typically includes a bi-layer actuator formed by depositing a layer of insulating material on the cantilever and by depositing a layer of resistive material on the insulating layer. The method typically comprises applying an alternating current to the resistive material, wherein the free end of the cantilever vibrates at substantially the same frequency as the applied alternating current, adjusting the applied alternating current over a range of frequencies, and determining the resonance frequency of the free end of the cantilever by measuring an output voltage of the piezo-resistive detector element as a function of the frequency of the applied alternating current.

According to yet another aspect of the invention, a method is provided for determining a parameter of an interaction using a micro-electro-mechanical detection device having a sensing element coupled to a free end of a cantilever and a piezo-resistive detector element coupled to a fixed end of the cantilever. The detection device also includes a bi-layer actuator formed by depositing a layer of insulating material on the cantilever and by depositing a layer of resistive material on the insulating layer. The method typically comprises applying an alternating current to the resistive material wherein the free end of the cantilever vibrates at substantially the same frequency as the applied alternating current, adjusting the applied alternating current over a range of frequencies, and measuring an output voltage of the piezo-resistive detector element as a function of the frequency of the applied alternating current so as to determine a first resonance frequency of the cantilever. In one embodiment, the method also typically comprises subjecting the sensing device to a physical interaction, wherein the physical interaction results in a change of mass of the sensing element, repeating the steps of adjusting and measuring so as to determine a second resonance frequency of the cantilever after said interaction, and thereafter calculating the change of mass of the sensing element using the first and second resonance frequencies.

Reference to the remaining portions of the specification, including the drawings and claims, will realize other features and advantages of the present invention. Further features and advantages of the present invention, as well as the structure and operation of various embodiments of the present invention, are described in detail below with respect to the accompanying drawings. In the drawings, like reference numbers indicate identical or functionally similar elements.

DESCRIPTION OF THE SPECIFIC EMBODIMENTS

Figures 1A, 1B:
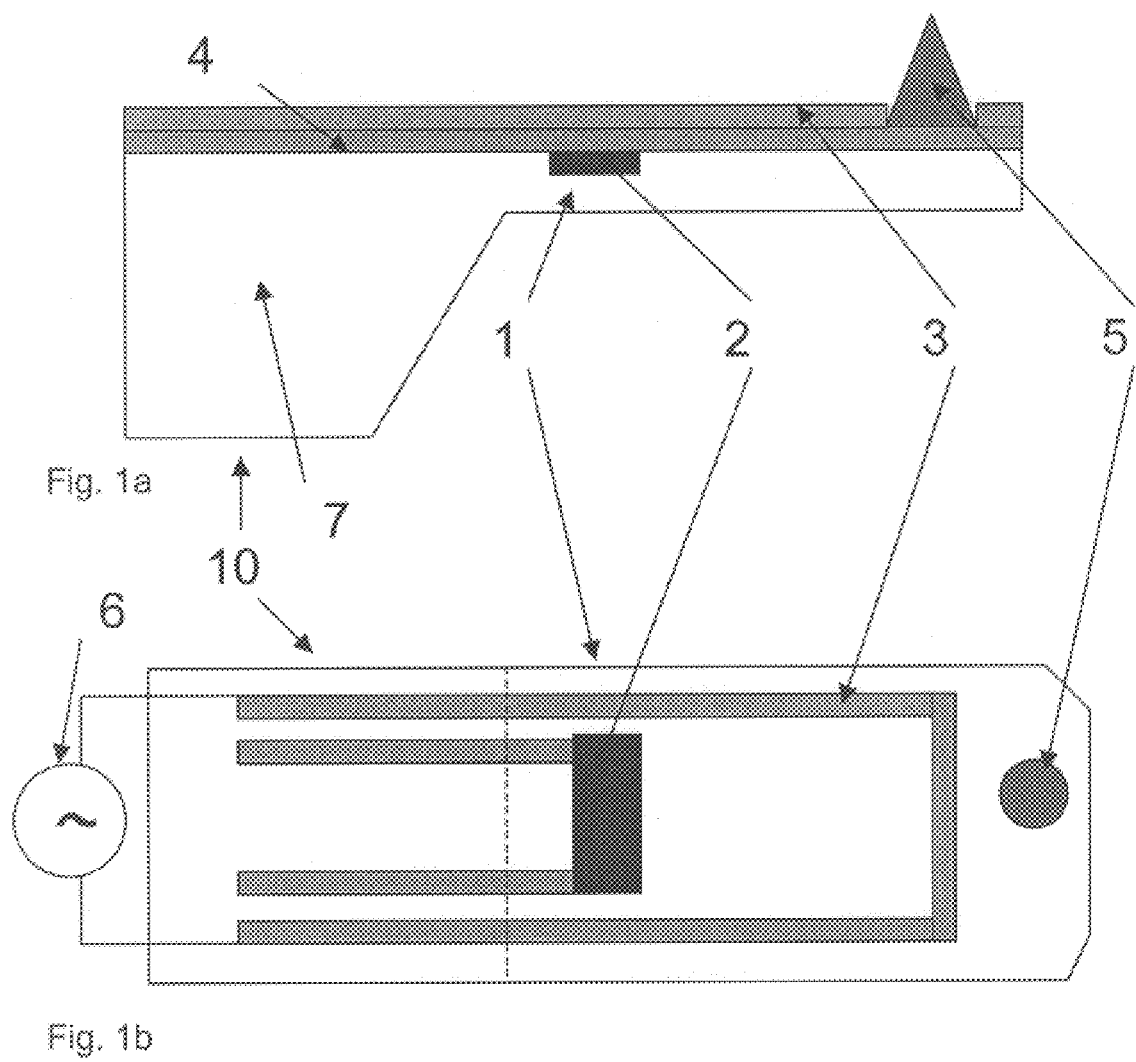
FIGS. 1a and 1b show a cross-sectional view and a top view, respectively, of an Integrated Semiconductor Piezoresistive Detector with a MEMS beam element (cantilever) and an actuator according to an embodiment of the present invention.

FIGS. 1a and 1b show a cross-sectional view and a top view, respectively, of an Integrated Semiconductor MEMS detection device 10 according to an embodiment of the present invention. Detection device 10 includes a beam element (cantilever) 1 integrated on, or attached to, a substrate 7. Substrate 7 typically comprises a silicon (Si) substrate, or other substrate, as is well known in the semiconductor industry. Detection device 10 also includes a Piezo-detector 2, which in the present embodiment includes a piezo-resistor electrically coupled to a calculation module (e.g., a controller, microprocessor, etc.; not shown) and a sensing element 5. Detection device 10 further includes a bi-layer actuator comprised of a thin film metal-based resistive heating element 3, such as, e.g., a thin layer of Al, and a thin film insulating layer 4, such as, e.g., a thin layer of $SiO_2$. Alternative materials may be used for the bi-layer actuator, including for example Cu, W, Ta, etc. for the conductive layer and SiC, Ta2O5, Ti3N4, etc. for the dielectric layer. Heating element 3 is coupled to a current source 6, which in one embodiment is an alternating current source.

As shown in FIG. 1a, piezo-resistor 2 is positioned at the base of the MEMS cantilever 1. By way of measuring the resistance of piezo resistor 2, the mechanical stress in the cantilever beam is evaluated. Thin film heating element 3, which in one embodiment is made of thin metal layer (e.g. Al), is positioned along the cantilever 1 as shown, and thin film insulating layer 4, e.g., $SiO_2$, separates the cantilever 1 and the heating element 3. The heating element 3 and the insulating layer 4 form the bi-layer actuator, which is susceptible to deformation due to the different thermal expansion coefficients of the materials. Sensing element 5 is located at the free end of the cantilever beam. In one embodiment, sensing element 5 includes a micro-tip or other structure having a known mass and made of material having known interaction properties depending on the desired application.

According to the present embodiment, application of an electrical current from the source 6 through heating element 3 causes a mechanical stress between the layers 3 and 4 of the actuator, thereby causing the cantilever to bend. When the source 6 provides an alternating current (a.c.) voltage signal, such bending alternates with substantially the same frequency as the source current. If the a.c. frequency is equal to the resonance frequency of the cantilever 1, a significant oscillation amplitude amplification takes place. By measuring the resistance of the piezo-resistor 2 over a range of applied a.c. frequencies, the resonance frequency of the system is determined.

Any physical or chemical interaction bringing about a change of the mass of the sensing element 5 (and thereby the mass of the cantilever), as well as any exposure to energy fluxes, causes a change of the resonance frequency of the detection device. Therefore, by measuring a shift in the resonance frequency before and after an interaction, parameters of the interaction/exposure can be determined.

According to the present invention, integration of the mechanical actuator in the sensor offers several advantages, including, for example, integration and miniaturization of the sensor elements in a single device, easy integration with digital computing/amplifying units, and simple driving algorithms for signal generation and computation.

Figure 2A:
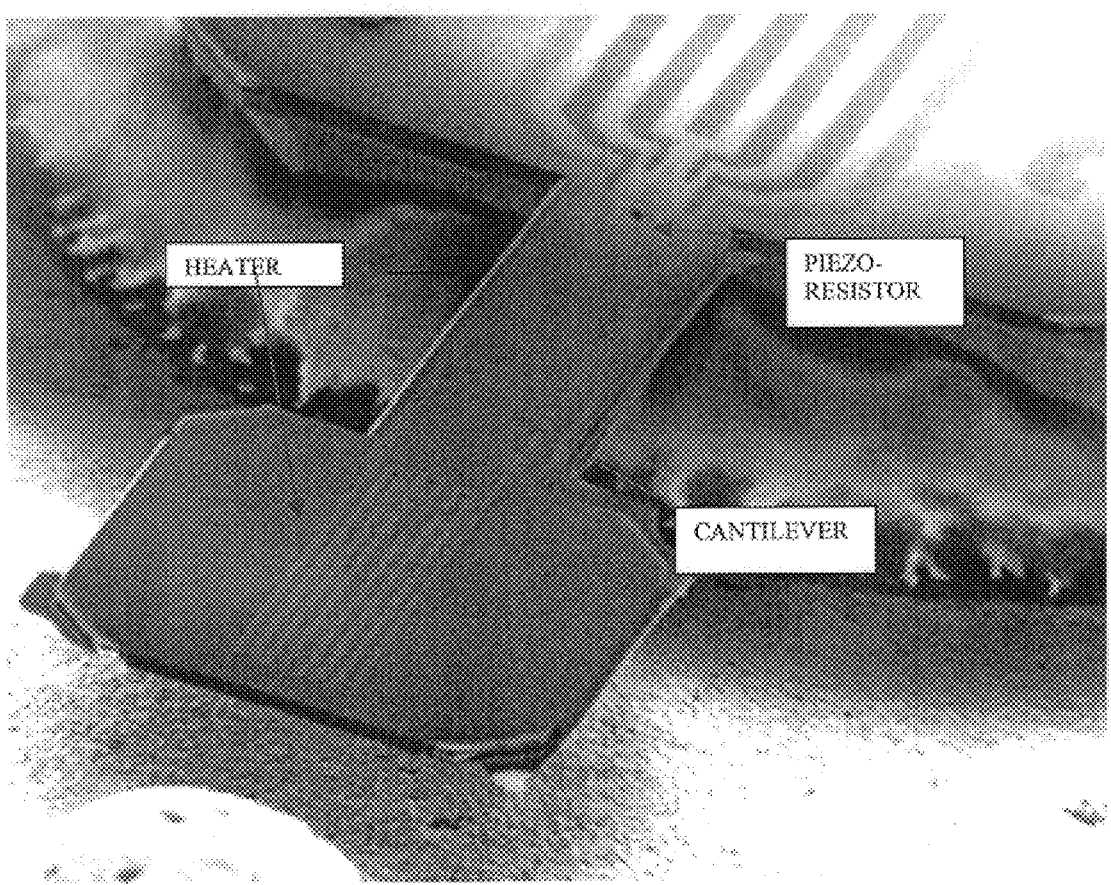
FIGS. 2a and 2b show two examples of MEMS detector devices according to the present invention.
Figure 2B:
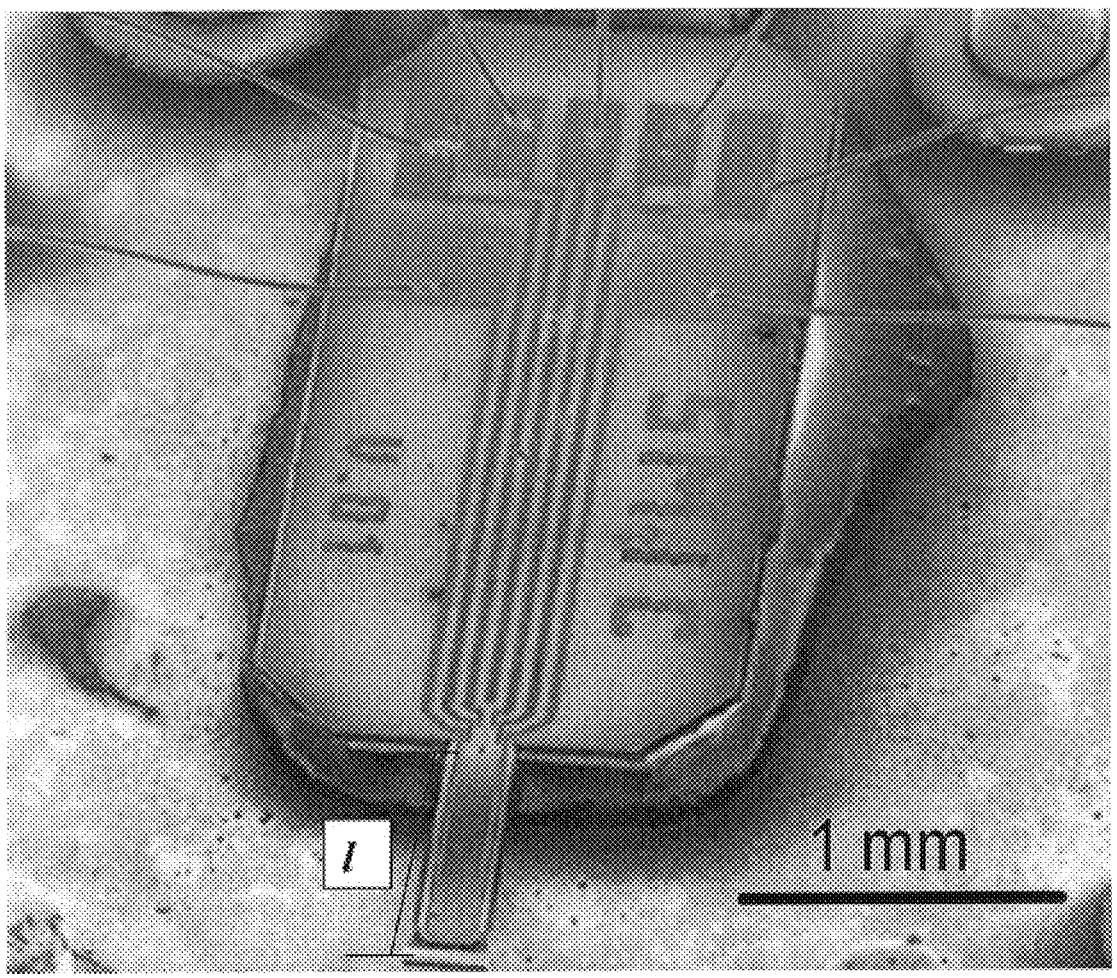

Two examples of MEMS detection devices according to the present invention, as used for different applications, are shown on FIGS. 2a and 2b, respectively.

In one embodiment, sensing element 5 includes a thin layer of material deposited on the free end of the cantilever. In one application, for example, the thin layer includes an organic polymer which readily adsorbs and desorbs water from the environment, thus enabling the detection of minute changes of the humidity in the air. Measuring a parameter of the interaction, such as the amount of material adsorbed or desorbed, by measuring the resonance frequency change using a detector device according to the present invention is explained in further detail below.

In another application, sensing element 5 includes a thin layer of an organic polymer mixture, having a specific spectral sensitivity, and being employed under the generic name "photoresist" in photolithographic steps of definition of microstructures, is exposed to irradiation with a flux of light photons (radiation) with energy corresponding to its maximum of sensitivity. By measuring the change of the material's mass after versus before the exposure, the amount of the ablated organic material is determined. Such application allows for the selection of materials that are ablating (or "outgasing") less than others, which is of tremendous importance for the microelectronics industry.

It should be appreciated that devices according to the present invention also allow for "in situ" monitoring of all measured parameters. It should also be appreciated that any material that is reactive with a certain substance or atmosphere, e.g., absorbing, desorbing, adsorbing, etc, or sensitive to any radiation exposure can be used to determine a parameter associated with the desired interaction(s)/reaction(s). For example, devices according to the present invention are useful for determining with high precision and accuracy small amounts of gases and/or vapors (e.g., hazardous materials and gases) by selective absorption into and/or adsorption onto specific thin films deliberately deposited onto the sensing element.

The physical principles of the working of a detection device according to the present invention will now be discussed using derived equations by which one can translate the changes of the oscillation frequency of the free end of the cantilever into changes of the output voltage parameter of the piezo-resistor, thus enabling the calculation of tiny changes of the mass and/or energy that have affected the sensing element of the cantilever. Using this process, changes in mass on the order of a picogram causes a detectable shift of on the order of about one Hertz, at the maximum peak of the frequency characteristics of the device, in accordance with the details of the following explanation.

Assume that a cantilever with a bi-morph layer structure, having a length l is in thermal equilibrium. Because of the electrical current supplied from the source 6 through the resistive heating element 3, the temperature T is changed by ΔT, and the cantilever will be deformed, with the free end being displaced by $z_T$, where $$Z_T = 3K_o \Delta T l^2, \quad [1]$$

and $$K_o = \frac{(\alpha_1 - \alpha_2)(t_1 + t_2)\frac{1}{t_2^2}}{4 + 6\left(\frac{t_1}{t_2}\right) + 4\left(\frac{t_1}{t_2}\right)^2 + \left(\frac{t_1}{t_2}\right)^3\left(\frac{E_1}{E_2}\right) + \left(\frac{t_2 E_2}{t_1 E_1}\right)},$$

and where $t_i$, $\alpha_i$, and $E_i$ are the thickness, the thermal expansion coefficient, and the Young modulus of the i-th layer of the bi-morph actuator (e.g., $SiO_2$ and Al layers), respectively.

When the heating element, e.g., heating element 3, is powered by a current source with its polarity alternating at a certain frequency, the cantilever oscillates with substantially the same frequency, and thus the free end of the cantilever follows a certain displacement path.

A displacement of the free end of the cantilever by z causes a change of the piezo-resistive detector voltage by:

$$U_p = \frac{3\xi dEU}{l^2} z, \quad [2]$$

where:

ξ is an average piezo-resistive coefficient, d is the cantilever thickness,

E is the Young modulus of the insulating layer, e.g., Silicon,

U is the detector voltage P.S., l is the length of the cantilever, and z is the amount of deflection.

From the equations [1] and [2] it follows that, at $z=z_T$, the output voltage of the piezo-resistor follows the phase of the a.c. signal applied to the heating element.

The resonance frequency of the cantilever is:

$$\nu = \frac{1}{2\pi}\sqrt{\frac{K}{m_0}} \quad [3]$$

where:

K is the elastic constant of the cantilever material, and $m_0$ is the effective mass of the cantilever.

In the case of a rectangular shaped cantilever (e.g., FIG. 2b) having mass m, the effective mass is:

$$m_0 = 0.24\, m \quad [4]$$

From equation [3] it follows that the effective mass change, Δm, can be expressed as:

$$\Delta m = \frac{K}{4\pi^2}\left(\frac{1}{\nu_1^2} - \frac{1}{\nu_2^2}\right) \quad [5]$$

where $\nu_1$ and $\nu_2$ are the resonance frequencies before and after the interaction/exposure of the sensing element, respectively.

Hence, by measuring the output voltage of the piezo-resistive detector 2 as a function of the frequency of the a.c. signal flowing through the heating element 3, the resonance frequency of the cantilever is determined (i.e., the resonance frequency is the frequency resulting in a maximum output voltage). Thus, by comparing the resonance frequencies before and after an interaction/exposure that leads to a change in mass of the material at the free end of the cantilever, and using equation [5], the effective mass change is Δm.

While the invention has been described by way of example and in terms of the specific embodiments, it is to be understood that the invention is not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. An integrated micro-electro-mechanical detection device comprising:

a cantilever having a free end and a fixed end coupled to a substrate;

a piezo-resistive detector coupled to the fixed end of the cantilever;

a sensing element located on the free end of the cantilever; and an actuator including a first thin film deposited on the cantilever and a second thin film deposited on the first thin film, wherein application of an alternating current to the second thin film causes the free end of the cantilever to vibrate at substantially the same frequency as the applied alternating current, and wherein an output voltage of the piezo-resistive detector is proportional to the phase of the applied alternating current.

2. The detection device of claim 1, wherein the first thin film comprises an electric insulator material, and wherein the second thin film comprises a resistive metal material.

3. The detection device of claim 2, wherein the insulator material comprises SiO2, and wherein the resistive metal material comprises aluminum.

4. The detection device of claim 1, wherein the sensing element includes a thin film of material selected from the group consisting of an organic polymer material, an organic material, and a photoresist.

5. A method of measuring the resonance frequency of a cantilever in a micro-electro-mechanical detection device having a sensing element coupled to a free end of the cantilever and a piezo-resistive detector element coupled to a fixed end of the cantilever, said detection device also including a bi-layer actuator formed by depositing a layer of insulating material on the cantilever and by depositing a layer of resistive material on the insulating layer, the method comprising:

applying an alternating current to the resistive material, wherein the free end of the cantilever vibrates at substantially the same frequency as the applied alternating current;

adjusting the applied alternating current over a range of frequencies; and determining the resonance frequency of the free end of the cantilever by measuring an output voltage of the piezo-resistive detector element as a function of the frequency of the applied alternating current.

6. The method of claim 5, wherein the sensing element includes a photoresist material, the method further comprising:

exposing the sensing element to radiation; and repeating the steps of adjusting and determining.

7. The method of claim 5, wherein the sensing element includes an organic polymer material which readily adsorbs and desorbs water, the method further comprising:

introducing the sensing element to an atmosphere containing water; and repeating the steps of adjusting and determining.

8. The method of claim 5, wherein the sensing element includes an organic polymer material which readily adsorbs and desorbs one or more specific substances, the method further comprising:

introducing the sensing element to an atmosphere reactive with at least one of said one or more specific substances; and repeating the steps of adjusting and determining.

9. The method of claim 5, wherein the sensing element includes an organic polymer material which readily adsorbs and desorbs one or more specific substances, the method further comprising:

introducing the sensing element to an atmosphere containing at least one of said one or more specific substances; and repeating the steps of adjusting and determining.

10. A method of determining a parameter of an interaction using a micro-electro-mechanical detection device having a sensing element coupled to a free end of a cantilever and a piezo-resistive detector element coupled to a fixed end of the cantilever, said cantilever including a bi-layer actuator formed by depositing a layer of insulating material on the cantilever and by depositing a layer of resistive material on the insulating layer, the method comprising:

applying an alternating current to the resistive material wherein the free end of the cantilever vibrates at substantially the same frequency as the applied alternating current;

adjusting the applied alternating current over a range of frequencies;

measuring an output voltage of the piezo-resistive detector element as a function of the frequency of the applied alternating current so as to determine a first resonance frequency of the cantilever;

subjecting the sensing device to a physical interaction, wherein the physical interaction results in a change of mass of the sensing element;

repeating the steps of adjusting and measuring so as to determine a second resonance frequency of the cantilever after said interaction; and thereafter calculating the change of mass of the sensing element using the first and second resonance frequencies.

11. The method of claim 10, wherein the parameter of the interaction is a function of the change in mass of the sensing element.

12. The method of claim 10, wherein the sensing element includes a photoresist material, and wherein the step of subjecting includes exposing the sensing element to radiation.

13. The method of claim 10, wherein the sensing element includes an organic polymer material which readily adsorbs and desorbs one or more specific substances, and wherein the step of subjecting includes introducing the sensing element to an atmosphere containing at least one of said one or more specific substances.

14. The method of claim 10, wherein the sensing element includes an organic polymer material which readily adsorbs and desorbs one or more specific substances, and wherein the step of subjecting includes introducing the sensing element to an atmosphere reactive with at least one of said one or more specific substances.

15. The method of claim 10, wherein the sensing element includes an organic polymer material which readily adsorbs and desorbs water, and wherein the step of subjecting includes introducing the sensing element to an atmosphere containing water.

16. The method of claim 10, wherein the steps of subjecting and repeating occur concurrently.

17. The method of claim 10, wherein the parameter of the interaction is a function of the change in the flux of energy exposing the sensing element.

* * * * *

UNITED STATES PATENT AND TRADEMARK OFFICE
CERTIFICATE OF CORRECTION

PATENT NO. : 6,457,360 B1
DATED : October 1, 2002
INVENTOR(S) : Ivan Stoykov Daraktvhiev et al.

It is certified that error appears in the above-identified patent and that said Letters Patent is hereby corrected as shown below:

<u>Title page,</u>
Item [73], Assignee should read as follows:

-- [73] Assignee: XPEQT AG, Beviax (CH); Conel Ltd., Botevgrad (BG) --.

Signed and Sealed this

Twenty-fourth Day of December, 2002

JAMES E. ROGAN
*Director of the United States Patent and Trademark Office*